(12) United States Patent
Kwon et al.

(10) Patent No.: US 10,599,200 B2
(45) Date of Patent: Mar. 24, 2020

(54) REAL TIME CLOCK BATTERY CHARGE/DISCHARGE SYSTEM OF NOTEBOOK, CHARGE/DISCHARGE CONTROL METHOD, AND NOTEBOOK REAL TIME CLOCK POWER SUPPLY METHOD

(71) Applicant: LG CHEM, LTD., Seoul (KR)

(72) Inventors: Jae Kuk Kwon, Chungcheongbuk-Do (KR); Young Su Son, Chungcheongbuk-Do (KR); Jong Gyu Sung, Chungcheongbuk-Do (KR); Young Kyu Lee, Chungcheongbuk-Do (KR)

(73) Assignee: LG Chem, Ltd., Seoul (KR)

( * ) Notice: Subject to any disclaimer, the term of this patent is extended or adjusted under 35 U.S.C. 154(b) by 185 days.

(21) Appl. No.: 15/942,755

(22) Filed: Apr. 2, 2018

(65) Prior Publication Data

US 2018/0356869 A1 Dec. 13, 2018

(30) Foreign Application Priority Data

Jun. 13, 2017 (KR) ........................ 10-2017-0074085

(51) Int. Cl.
| | | |
|---|---|---|
| *G06F 1/28* | (2006.01) | |
| *G06F 1/20* | (2006.01) | |
| *G06F 1/16* | (2006.01) | |
| *H02K 7/14* | (2006.01) | |
| *G06F 1/26* | (2006.01) | |
| *H01M 10/04* | (2006.01) | |
| *H05K 7/20* | (2006.01) | |
| *H02J 7/00* | (2006.01) | |
| *H02K 7/00* | (2006.01) | |

(52) U.S. Cl.
CPC .............. *G06F 1/28* (2013.01); *G06F 1/1635* (2013.01); *G06F 1/203* (2013.01); *G06F 1/206* (2013.01); *G06F 1/263* (2013.01); *H01M 10/0436* (2013.01); *H02J 7/00* (2013.01); *H02J 7/0029* (2013.01); *H02J 7/0075* (2013.01); *H02K 7/14* (2013.01); *H05K 7/20136* (2013.01); *H01M 2220/30* (2013.01); *H02K 7/003* (2013.01)

(58) Field of Classification Search
CPC ... G06F 1/28; G06F 1/26; G06F 1/263; G06F 1/1635; G06F 1/206; G06F 1/203; G06F 1/14; H02J 7/0029; H02J 7/0075; H02J 7/00; H02J 7/20136; H02J 7/14; H01M 10/0436; H02K 7/14; H02K 11/04
USPC .......................................................... 320/128
See application file for complete search history.

(56) References Cited

U.S. PATENT DOCUMENTS

| | | | | |
|---|---|---|---|---|
| 5,539,298 A | * | 7/1996 | Perkins ................. | H02J 7/0004 320/106 |
| 5,758,172 A | * | 5/1998 | Seo ............................ | G06F 1/28 713/300 |
| 7,466,265 B1 | * | 12/2008 | Huang ..................... | G01S 19/24 342/357.63 |

(Continued)

*Primary Examiner* — M Baye Diao
(74) *Attorney, Agent, or Firm* — Morgan, Lewis & Bockius LLP

(57) ABSTRACT

The present disclosure relates to a Real Time Clock (RTC) battery charge/discharge system, a charge/discharge control method, and a notebook RTC power supply method of a notebook used for date and time synchronization of an RTC of a notebook computer.

9 Claims, 4 Drawing Sheets

(56) References Cited

U.S. PATENT DOCUMENTS

| | | | | |
|---|---|---|---|---|
| 7,550,954 B2* | 6/2009 | De Nisi | ............ | H02M 1/10 |
| | | | | 307/45 |
| 7,638,100 B2* | 12/2009 | Dawes | ............ | B01L 7/00 |
| | | | | 221/150 A |
| 9,045,028 B2* | 6/2015 | Ichikawa | ............ | B60H 1/00207 |
| 9,229,472 B2* | 1/2016 | Tsukamoto | ............ | G06F 1/14 |
| 9,841,805 B2* | 12/2017 | Shimada | ............ | G06F 1/324 |
| 2008/0211509 A1* | 9/2008 | Ho | ............ | G01R 31/3648 |
| | | | | 324/431 |

* cited by examiner

[FIG. 1]
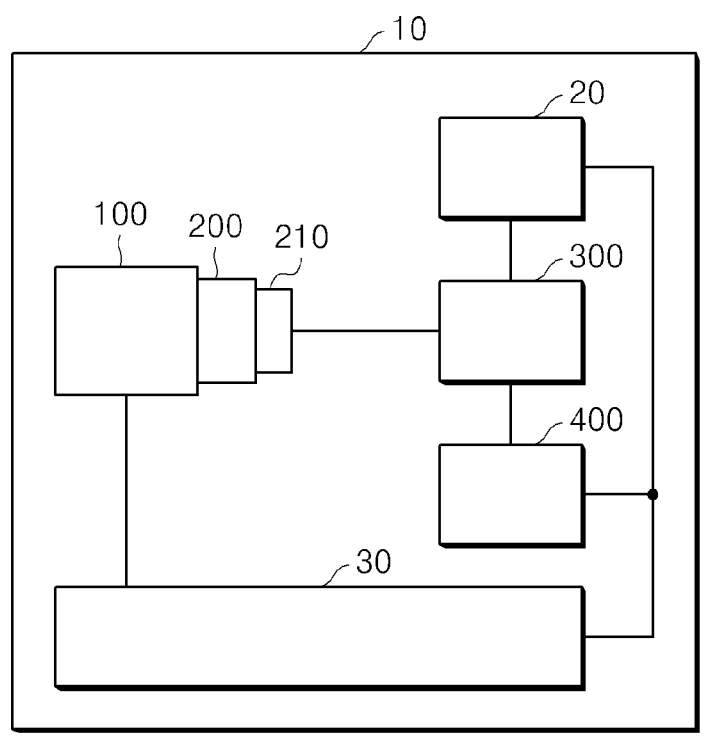

[FIG. 2]
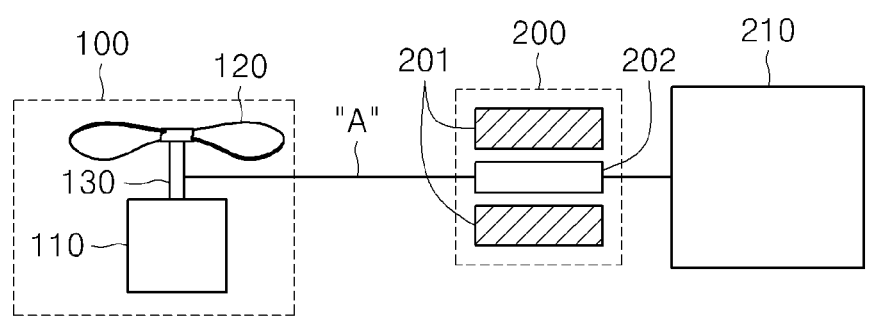

[FIG. 3]
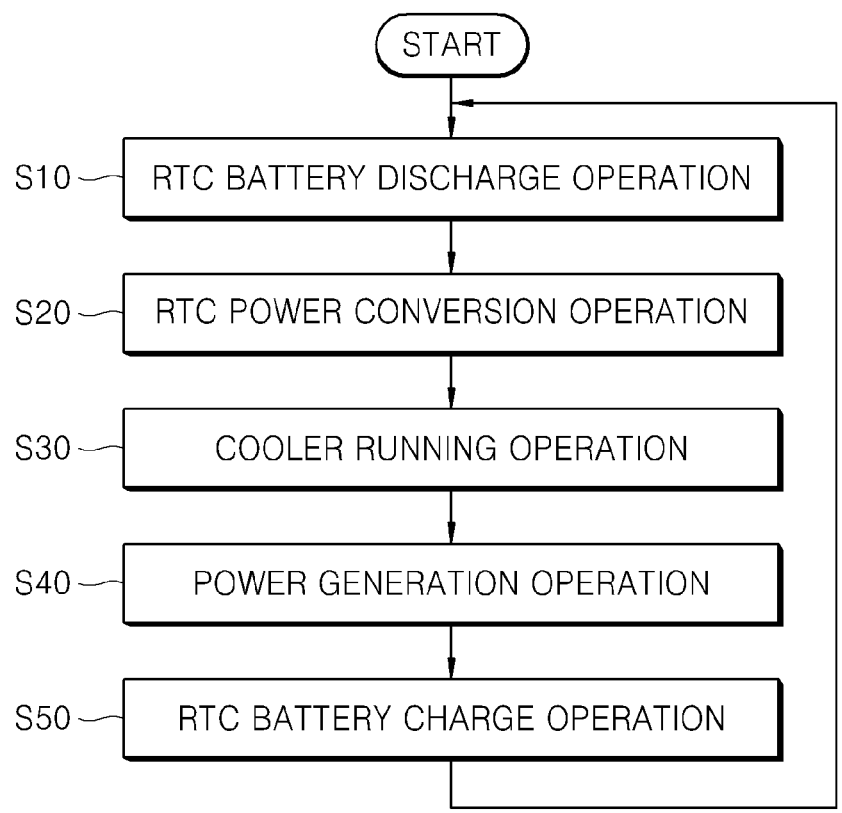

[FIG. 4]
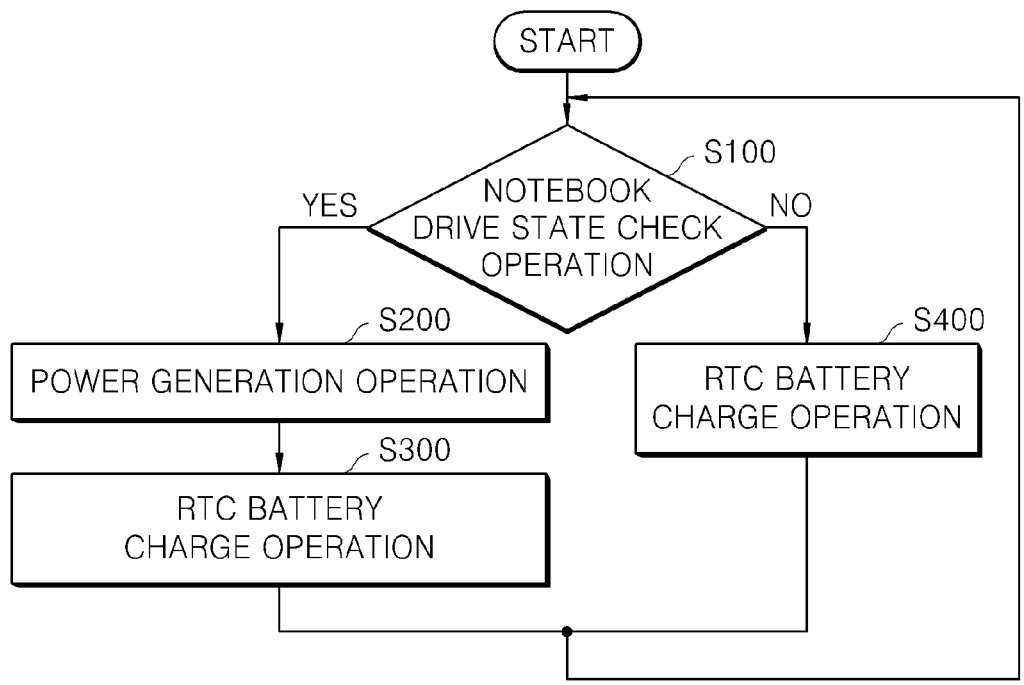

REAL TIME CLOCK BATTERY CHARGE/DISCHARGE SYSTEM OF NOTEBOOK, CHARGE/DISCHARGE CONTROL METHOD, AND NOTEBOOK REAL TIME CLOCK POWER SUPPLY METHOD

CROSS-REFERENCE TO RELATED APPLICATION

This application claims priority to Korean Patent Application No. 10-2017-0074085 filed on Jun. 13, 2017 and all the benefits accruing therefrom under 35 U.S.C. § 119, the contents of which are incorporated by reference in their entirety.

BACKGROUND

The present disclosure relates to a Real Time Clock (RTC) battery charge/discharge system, a charge/discharge control method, and a notebook RTC power supply method of a notebook used for date and time synchronization of an RTC of a notebook computer.

An RTC device is a device for obtaining information on the present time in various computer devices. In many cases, the computer device needs to check information on the current time in real time in order to perform a task requested by a user. Accordingly, the RTC device is configured with the system or separately to provide the system with date information such as year, month, day, and day of the week, and time information such as hour, minute, and second. Conventionally, the RTC has been driven using a coin-type mercury battery for date and time synchronization while the notebook is not driven and the power is off. Recently, notebooks are getting lighter and more efforts are being made to reduce the weight of notebooks. In addition, the coin-type mercury batteries have been required to be replaced every 2 to 3 years, and thus users have been complaining of inconvenience.

SUMMARY

The present invention provides a Real Time Clock (RTC) battery charge/discharge system of a notebook, a charge/discharge control method, and a notebook RTC power supply method to reduce the inconvenience of replacing the battery by lightening and charging an RTC battery that operates an RTC of a notebook.

In accordance with an exemplary embodiment, a Real Time Clock (RTC) battery charge/discharge system of a notebook includes: a cooler including a driving motor and a cooling fan for receiving power from a main battery and discharging a heat generated when the notebook is driven; an RTC battery configured to supply power to allow a notebook RTC to operate; a small power generation motor configured to generate power by driving the cooler and supply the generated power to the RTC battery; and a control unit configured to control charge and discharge of the RTC battery according to a drive state of the notebook and control supply and interruption of power from the main battery to the notebook RTC.

The small power generation motor may include a stator and a rotator, and one side of the rotator may be mechanically connected to a rotating shaft of the cooling fan.

The small power generation motor may further include a conversion converter configured to convert a generated AC power into DC power.

The RTC battery may be a pouch type battery in which a negative electrode plate and a positive electrode plate, an electrode assembly having a separation layer interposed between the negative electrode plate and the positive electrode plate, and a charge/discharge control module for controlling charge/discharge are received.

When the notebook is driven, the RTC battery may be charged by a DC power generated by the small power generation motor through an operation of the cooler, and when the notebook is not driven, the RTC battery may supply the charged power as DC power to the RTC of the notebook.

When the notebook is driven, the control unit may supply power from the main battery to the RTC of the notebook, and switch the RTC battery to a charge state to charge the RTC battery by a power generated by the small power generation motor, and when the notebook is not driven, the control unit may cut off a power supplied from the main battery to the RTC of the notebook, and switch the RTC battery to a discharge state to supply power from the RTC battery to the RTC of the notebook.

Charge/discharge control and power supply/cut-off operations of the control unit may be determined by a software module mounted on a system ROM of the notebook.

In accordance with another exemplary embodiment, a method of supplying power to a Real Time Clock (RTC) of a notebook includes: an RTC battery discharge operation for supplying power from an RTC battery to the RTC of the notebook while the notebook is power-off and the drive is stopped; an RTC power conversion operation for, when the notebook is driven, cutting off the power supplied from the RTC battery to the RTC of the notebook by switching the RTC battery to a charge state in the control unit, and supplying power from a main battery of the notebook to the RTC of the notebook; a cooler running operation for operating a cooler of the notebook; a power generation operation for generating power in a small power generation motor interlocked with the cooler when the cooler is operated; and An RTC battery charge operation for supplying the power generated by the small power generation motor to the RTC battery switched to a charge state.

In accordance with yet another exemplary embodiment, a method of controlling charge/discharge of a Real Time Clock (RTC) battery according to a notebook drive state includes: a notebook drive state check operation for checking a notebook drive state by determining whether a notebook power is on or off; a power generation operation for switching the RTC battery to a charge state when the notebook is on and generating power by a small power generation motor interlocked with a cooler of the notebook; an RTC battery charge operation for supplying the power generated by the power generation operation to the RTC battery to charge the RTC battery; and an RTC battery discharge operation for switching the RTC battery to a discharge state when the notebook is off and supplying a discharge power to the RTC of the notebook.

BRIEF DESCRIPTION OF THE DRAWINGS

Exemplary embodiments can be understood in more detail from the following description taken in conjunction with the accompanying drawings, in which:

FIG. 1 is a configuration diagram of an RTC battery charge/discharge system of a notebook computer according to an embodiment of the present invention;

FIG. 2 is a schematic diagram illustrating a configuration of a cooler, a small power generation motor, and a conversion converter of an RTC battery charge/discharge system of a notebook computer according to the present invention;

FIG. 3 is a flowchart illustrating a method of supplying power to an RTC of a notebook according to an embodiment of the present invention; and FIG. 4 is a flowchart of a charge/discharge control method of an RTC battery according to an embodiment of the present invention.

DETAILED DESCRIPTION OF EMBODIMENTS

Hereinafter, embodiments of the present invention will be described in detail with reference to the accompanying drawings so that those skilled in the art can easily carry out the present invention. The present invention may, however, be embodied in different forms and should not be construed as limited to the embodiments set forth herein. Parts not relating to description are omitted in the drawings in order to clearly describe the present invention and like reference numerals refer to like elements throughout.

Throughout the specification, when a portion is referred to as being "connected" to another portion, it includes not only "directly connected" but also "electrically connected" with another element therebetween. Furthermore, when it is described that one comprises (or includes or has) some elements, it should be understood that it may comprise (or include or has) only those elements, or it may comprise (or include or have) other elements as well as those elements if there is no specific limitation. The term "~ing operation" or "operation of ~ing" used throughout the specification does not mean "operation for ~ing".

First, Real Time Clock (RTC) will be described.

The RTC is basically installed in a currently produced and sold computer system such as a portable computer and is a clock module embedded in a computer system to accurately record and inform the current time.

The RTC provides an alarm function and a programmable timer interrupt function by providing the computer system with information such as the current time although it is not directly used for the operation performed by the computer system, and in addition, the computer system may display the time information provided by the RTC to the user, and may be used to record information on the generation time of various programs and data. In addition, the RTC also informs the start time of the task to be performed based on a specific time.

Since the RTC serves as a reference for various functions in such a way, it is very important that the RTC continues to operate even in the absence of external input power.

In order for the RTC to continue to operate, an RTC battery that supplies power to the RTC is required even in a situation where the notebook is not driven. Hereinafter, a device and method for charging the RTC battery will be described in detail.

FIG. 1 is a configuration diagram of an RTC battery charge/discharge system of a notebook computer according to an embodiment of the present invention, and FIG. 2 is a schematic diagram illustrating a configuration of a cooler, a small power generation motor, and a conversion converter of an RTC battery charge/discharge system of a notebook computer according to the present invention.

Referring to FIGS. 1 and 2, the RTC battery charge/discharge system of a notebook according to the present invention includes a cooler 100 for discharging heat generated when the notebook 10 is driven, an RTC battery 300 for supplying power to the RTC 20 of the notebook 10, a small power generation motor 200 for generating power by driving the cooler 100 and supplying the power to the RTC battery 300, and a control unit 400 for controlling charge/discharge of the RTC battery and controlling supply and interruption of power from the main battery to the notebook RTC.

A notebook cooler is usually installed in a notebook to discharge heat generated therein when the notebook is in operation. The cooler 100 according to an embodiment of the present invention includes a driving motor 110 and a cooling fan 120, and the driving motor 110 and the cooling fan 120 are mechanically connected to each other by a rotating shaft 130.

In addition, when the notebook is driven, the driving motor 110 is rotated by receiving power from the main battery 30 to rotate the cooling fan 120 connected to the rotating shaft 130.

Accordingly, the cooler 100 generates a flow of air by the rotation of the cooling fan 120 so that the driving heat generated by the electronic elements during the driving of the notebook 10 may be prevented from being discharged to the outside of the notebook 10 to raise the temperature inside the notebook 10.

The small power generation motor 200 may include a stator 201 and a rotator 202. The stator 201 may be composed of a permanent magnet. The rotator 202 is constituted by a conductor and is positioned at the center where the stator 201 is disposed so as to face each other.

One side of the rotator 202 may be mechanically connected to the rotating shaft 130 of the cooling fan 120 by a connection line A.

The connection line A and the rotating shaft 130 of the cooling fan 120 may be configured to convert the rotational force of the rotating shaft 130 into the rotational force of the connection line A by a mechanical structure such as a gear.

In the present description, gears are used, but there is no restriction on the configuration thereof, and it is possible to use a configuration capable of converting and transmitting a rotational force.

Accordingly, when the cooling fan 120 rotates, the small power generation motor 200 transmits its rotational force from the rotating shaft 130 to the connection line A to rotate the rotator 202 of the small power generation motor 200 and generate power.

In relation to the power generated by the small power generation motor 200, AC power is generated by rotation of the rotator 202 and needs to be changed to DC power.

Accordingly, the small power generation motor 200 may further include a conversion converter 210 that converts the generated AC power into DC power.

For example, the conversion converter 210 may be mounted inside the small power generation motor 200, but the mounting position thereof is not limited.

The conversion converter 210 is electrically connected to the RTC battery 300 and converts the AC power generated by the small power generation motor 200 into DC power and supplies the DC power to the RTC battery 300, thereby charging the RTC battery 300.

The RTC battery 300 may be configured as a pouch type battery (not shown) in which a negative electrode plate (not shown) and a positive electrode plate (not shown), an electrode assembly having a separation layer (not shown) interposed between the negative electrode plate and the positive electrode plate, and a charge/discharge control module for controlling charge/discharge are received.

When the notebook is running, the RTC battery is charged by the DC power generated by the small power generation motor 200 through the operation of the cooler 100, and when the notebook is not in operation, DC power is supplied to the RTC of the notebook, so that the RTC battery may perform date and time synchronization even when the notebook is not running.

When the notebook is driven, the control unit supplies power from the main battery 30 to the RTC of the notebook, and turns the RTC battery into a charge state so that the RTC battery is charged.

In addition, If the notebook is not driven, the control unit interrupts the power supplied from the main battery 30 to the RTC of the notebook and turns the RTC battery into a discharge state, so that power is supplied from the RTC battery to the RTC of the notebook to enable date and time synchronization.

Charge/discharge control of the RTC battery of the control unit and power supply/cutoff from the main battery to the main battery are determined by the software module mounted on the system ROM of the notebook. The control unit may be a CPU or a separate microprocessor.

The control unit reads the program of the software module loaded in the system ROM according to the operating state of the notebook and operates, so that it controls the charge/discharge of the battery and supplies and cuts off power supplied from the main battery to the RTC.

Hereinafter, a method of supplying power to the RTC of a notebook computer according to an embodiment of the present invention will be described.

FIG. 3 is a flowchart illustrating a method of supplying power to an RTC of a notebook according to an embodiment of the present invention.

Referring to FIG. 3, a method of supplying power to an RTC of a notebook according to an embodiment of the present invention includes an RTC battery discharge operation S10, an RTC power conversion operation S20, a cooler running operation S30, a power generation operation S40, and an RTC battery charge operation S50.

The RTC battery discharge operation S10 is that when the notebook is powered off and not in operation, for date and time synchronization, the RTC battery maintains the discharge status and supplies power to the RTC of the notebook.

The RTC power conversion operation S20 is that when the notebook is running, by turning the RTC battery into a charge state, the power supplied from the RTC battery to the RTC of the notebook is cut off and the power is supplied from the main battery of the notebook to the RTC of the notebook.

The cooler running operation S30 is that when the notebook is running, by supplying power to the cooler from the main battery of the notebook, the performance of the notebook is prevented from being deteriorated by the driving heat generated by the operation of the notebook.

The power generation operation S40 is that when the cooler is operated in the cooler running operation S30, the cooling fan of the cooler is rotated and the rotator of the small power generation motor interlocked with the rotating shaft of the cooling fan rotates to generate power.

The RTC battery charge operation S50 is that the power generated by the small power generation motor in the power generation operation S40 is supplied to the RTC battery switched to a charge state in the RTC power conversion operation S20, so that the RTC battery is charged.

Hereinafter, a method of controlling the charge/discharge of the RTC battery according to the notebook driving state according to an embodiment of the present invention will be described.

FIG. 4 is a flowchart of a charge/discharge control method of an RTC battery according to an embodiment of the present invention.

Referring to FIG. 4, a charge/discharge control method of an RTC battery according to an embodiment of the present invention includes a notebook drive state check operation S100, a power generation operation S200, an RTC battery charge operation S300, and an RTC battery discharge operation S400.

The drive state check operation S100 of the notebook determines on/off of the power of the notebook to check a drive state of the notebook.

The power generation operation S200 is that if it is determined that the notebook is turned on and driven in the notebook drive state check operation S100, the RTC battery is switched to the charge state, and power is generated from the small power generation motor interlocked with the cooler of the notebook.

The RTC battery charge operation S300 supplies power generated in the power generation operation S200 to the RTC battery to charge the RTC battery.

The RTC battery discharge operation S400 is that if it is determined that the notebook is turned off and is not driven in the notebook drive state check operation S100, the RTC battery is switched to the discharge state to supply the discharge power to the RTC of the notebook.

As described above, the RTC battery charge device of the notebook computer according to an embodiment of the present invention generates power by the rotation of the cooler while the cooler is operating in a power on state in which the notebook is operated and charges the RTC battery with the generated power, and when the notebook is off and not in operation, supplies power from the RTC battery to the RTC of the notebook so that time synchronization of the notebook may be continuously performed.

Moreover, compared to coin-type mercury batteries, which are used for time synchronization in conventional notebooks, the present invention has the advantage of being able to reduce weight in the event of the development of thinner and lighter notebooks.

In addition, although the conventional coin-type mercury batteries have been inconveniently replaced when they have reached the end of their life, in relation to the RTC battery charge/discharge system of the notebook, the charge/discharge control method of the RTC battery, and the notebook RTC power supply method according to the present invention, the use of a pouch-type battery capable of charge/discharge also has the advantage of significantly increasing the life span of the battery.

In relation to the RTC battery charge/discharge system of the notebook, the charge/discharge control method of the RTC battery, and the notebook RTC power supply method according to preferred embodiments of the present invention, by using the rotational force of the cooler that operates for the heat dissipation of the notebook, power may be generated to charge the small battery and lighter weight may be provided compared to the coin type mercury battery. Therefore, lightweight notebooks may be provided.

Although the RTC battery charge/discharge system, the charge/discharge control method, and the notebook RTC power supply method of the notebook have been described with reference to the specific embodiments, they are not limited thereto. Therefore, it will be readily understood by those skilled in the art that various modifications and changes can be made thereto without departing from the spirit and scope of the present invention defined by the appended claims.

What is claimed is:

1. A Real Time Clock (RTC) battery charge/discharge system of a notebook, the system comprising:
    a cooler including a driving motor and a cooling fan for receiving power from a main battery and discharging a heat generated when the notebook is driven;
    an RTC battery configured to supply power to allow a notebook RTC to operate;
    a small power generation motor configured to generate power by driving the cooler and supply the generated power to the RTC battery; and
    a control unit configured to control charge and discharge of the RTC battery according to a drive state of the notebook and control supply and interruption of power from the main battery to the notebook RTC.

2. The system of claim 1, wherein the small power generation motor comprises a stator and a rotator, and
    one side of the rotator is mechanically connected to a rotating shaft of the cooling fan.

3. The system of claim 1, wherein the small power generation motor further comprises a conversion converter configured to convert a generated AC power into DC power.

4. The system of claim 1, wherein the RTC battery is a pouch type battery in which a negative electrode plate and a positive electrode plate, an electrode assembly having a separation layer interposed between the negative electrode plate and the positive electrode plate, and a charge/discharge control module for controlling charge/discharge are received.

5. The system of claim 1, wherein when the notebook is driven, the RTC battery is charged by a DC power generated by the small power generation motor through an operation of the cooler, and when the notebook is not driven, the RTC battery supplies the charged power as DC power to the RTC of the notebook.

6. The system of claim 1, wherein
    when the notebook is driven, the control unit supplies power from the main battery to the RTC of the notebook, and switches the RTC battery to a charge state to charge the RTC battery by a power generated by the small power generation motor, and
    when the notebook is not driven, the control unit cuts off a power supplied from the main battery to the RTC of the notebook, and switches the RTC battery to a discharge state to supply power from the RTC battery to the RTC of the notebook.

7. The system of claim 1, wherein charge/discharge control and power supply/cut-off operations of the control unit are determined by a software module mounted on a system ROM of the notebook.

8. A method of supplying power to a Real Time Clock (RTC) of a notebook, the method comprising:
    an RTC battery discharge operation for supplying power from an RTC battery to the RTC of the notebook while the notebook is power-off and the drive is stopped;
    an RTC power conversion operation for, when the notebook is driven, cutting off the power supplied from the RTC battery to the RTC of the notebook by switching the RTC battery to a charge state in the control unit, and supplying power from a main battery of the notebook to the RTC of the notebook;
    a cooler running operation for operating a cooler of the notebook;
    a power generation operation for generating power in a small power generation motor interlocked with the cooler when the cooler is operated; and
    an RTC battery charge operation for supplying the power generated by the small power generation motor to the RTC battery switched to a charge state.

9. A method of controlling charge/discharge of a Real Time Clock (RTC) battery according to a notebook drive state, the method comprising:
    a notebook drive state check operation for checking a notebook drive state by determining whether a notebook power is on or off;
    a power generation operation for switching the RTC battery to a charge state when the notebook is on and generating power by a small power generation motor interlocked with a cooler of the notebook;
    an RTC battery charge operation for supplying the power generated by the power generation operation to the RTC battery to charge the RTC battery; and
    an RTC battery discharge operation for switching the RTC battery to a discharge state when the notebook is off and supplying a discharge power to the RTC of the notebook.

* * * * *